United States Patent [19]
Kiyokawa

[11] Patent Number: 5,722,514
[45] Date of Patent: Mar. 3, 1998

[54] TRAY INSTALLATION RACK FOR TEST HANDLER

[75] Inventor: Toshiyuki Kiyokawa, Kuki, Japan

[73] Assignee: Advantest Corp., Tokyo, Japan

[21] Appl. No.: 636,269

[22] Filed: Apr. 26, 1996

[30] Foreign Application Priority Data

Apr. 28, 1995 [JP] Japan .................. 7-129848

[51] Int. Cl.[6] .................................. B66B 9/02
[52] U.S. Cl. ........................... 187/270; 187/240
[58] Field of Search ...................... 187/240, 243, 187/244, 270, 271, 406, 414

*Primary Examiner*—Kenneth Noland
*Attorney, Agent, or Firm*—Muramatsu & Associates

[57] ABSTRACT

A tray installation rack is used for a test handler to install therein a plurality of trays each of which has a large number of IC devices to be tested. The tray installation rack includes, a main base fixed to the test handler, a slide base slidably mounted on the main base and has a floor for receiving the trays thereon, a pair of tray guide bars perpendicularly mounted on the slide base to meet two adjacent sides of the trays for limiting movements of the trays in two horizontal directions, a pair of tray adjust bars slidably provided on the slide base to press the trays against the pair of guide bars in the two horizontal directions, an elevator provided on the test handler to lift the trays in a vertical direction in the tray installation rack until an uppermost tray exceeds top ends of the tray guide bars, a pair of tray pushers provided at top portions of the tray adjust bars, and tray standard members mounted on the main base at immediately above the top ends of the tray guide bars to restrict movements of the uppermost tray in the two horizontal directions, wherein the uppermost tray is positioned when the uppermost tray is pressed by the tray pushers against the tray standard members.

9 Claims, 7 Drawing Sheets

TRAY INSTALLATION RACK FOR TEST HANDLER

FIELD OF THE INVENTION

This invention relates to a tray installation rack to be incorporated in a test handler for installing a plurality of trays carrying IC devices to be tested, and more particularly, to a tray installation rack on the test handler for accurately positioning different sizes of trays having IC devices to be tested and assuring an easy and safe work of loading and unloading the trays for the test handler.

BACKGROUND OF THE INVENTION

In testing IC devices, an automatic test handler is frequently used in combination with an IC tester to automatically provides IC devices (DUT) to be tested to a test position (test head) of the IC tester. There are generally two types of test handlers, a self-drop type handler wherein the IC devices to be tested are transferred in a vertical direction with their own gravity and a tray type handler wherein IC devices aligned on a tray are transferred in a horizontal direction to the test position either directly or via a test tray.

In a typical tray type test handler, IC devices to be tested are aligned on a tray which is sometimes called a customer tray provided by manufacturers of the IC devices. The size of the tray varies depending on the type of IC devices and the manufacture of the IC devices.

A plurality of such trays are installed in a tray installation rack prior to the testing. During the testing, the IC devices on the trays are removed from the tray and loaded on a test by a pick and place mechanism of the test handler. The test tray is specially made for the test handler to carry the IC devices to the test head of the IC tester where the IC devices are tested. Alternatively, the IC devices to be tested are transferred directly to the test head by the pick and place mechanism of the test handler. The IC devices are sorted based on the test result. This invention relates to such a tray installation rack to be used in such a tray type test handler.

As noted above, a tray installation rack of a tray type test handler involves processes of placing a number of trays containing IC devices to be tested in a container like portion of the tray installation rack, providing the IC devices automatically to an IC test system by replacing the IC devices on the trays to the test trays. During the processes, each tray is lifted by an elevator mechanism provided in the tray installation rack and the IC devices at the top position of the tray are transferred to the test tray by the pick and place mechanism of the test handler.

Therefore, the tray installation rack is required to have a precise positioning ability to accurately shift the trays so that the IC devices are transferred to the test tray without an error. Further, the tray installation rack is required to safely and efficiently load and unload a large number of trays before and after the testing. Since the size of the tray varies, the tray installation rack needs to have a mechanism for positioning such differently sized trays to accommodate various type of trays and IC devices.

FIGS. 3-5 show a first example of conventional tray installation rack to be used in a test handler. This example is a tray installation rack designed with the main purpose of precise positioning the trays.

FIG. 3 is a perspective view and FIG. 4 is a side view of the tray installation rack. The tray installation rack of FIGS. 3-5 include a main base 80, adjustment bars 25, tray pushers 26, an elevator 35, linear guides 45, a gear 75 and a linear head 76. A plurality of trays 90 are stacked in a container like portion formed by the main base 80 and the adjustment bars 25 as shown in FIGS. 3 and 4.

Although not shown, a large number of IC devices to be tested are mounted on each tray 90. The test handler system picks up these IC devices and transfers and places them on the test trays or a test socket of the test head. The test trays horizontally move in the test handler to the test head of the IC test system whereby electrical testing for the IC devices is performed. Numerous trays 90 are piled up and stored in the tray installation rack. The trays 90 are lifted to a predetermined position by the elevator 35. The associated mechanism of the linear guides 45, the gear 75 and the linear head 76 are provided to accurately drive the elevator 35 in the vertical direction.

As noted above, according to the kind of IC devices, there are several trays with different sizes. In order to handle various sizes of trays, the tray installation rack is provided with a positioning system formed of the main base 80, adjustment bars 25 and the tray pushers 26 to determine the position of the trays in X and Y directions. It should be noted that although the tray installation rack can accommodated difference sizes of trays, the same trays are installed in the tray installation rack for each test. In other words, differently sized trays are not installed together in the tray installation rack.

The main base 80 is fixedly provided on the test handler to determine the positioning reference of the test handler system. As shown in FIG. 3, the main base 80 has a floor and X and Y walls. The X and Y walls limit the movement of the trays 90 in the X and Y directions. The trays 90 are placed at the corner formed by the X and Y walls of the main base 80 to determined the position in the X direction and Y direction of the test handler. For doing this, the trays 90 are pressed toward the X and Y directions by the tray adjust bars 25 and the tray pushers 26.

In general, the bigger the elevator 35 for lifting the trays 90, the easier it becomes to secure the horizontal position of the trays 90. FIG. 5 is a plan view of the tray installation rack including the elevator 35 which loads the trays 90. The horizontal surface (floor) of the elevator 35 which lifts the tray 90 is structured to be wide enough to accommodate the largest tray except for the portion in which the tray adjust bars 25 move back and forth. Hence, it has the surface defined by the pints a, b, c, d, e, f, g, h, i, j, k, l, as shown by the hatched lines excluding the area defined by the points d, e, f, g and i, j, k, l in which the movement of the tray adjust bars 25 is secured.

The tray adjust bars 25 are arranged so that both bars can move in the X and Y directions, respectively, until reaching the minimum tray size. Thus, the minimum tray size is determined by the X and Y walls (upper and right sides of FIG. 5) and the two surfaces of the tray adjust bars 25 facing the X and Y walls. The rectangular surface defined by the points a, b, c, h of the elevator 35 has the area that can cover the maximum tray size. Thus, even if the trays are with different sizes, the trays 90 are always maintained horizontally because the elevator 35 floor has a sufficient space to receive the trays.

To provide the trays 90 at a position suitable for picking the IC devices to be tested and placing them on the test tray or directly on the test head, the tray 90 is lifted or lowered to a desired position by the elevator 35 by the following operation.

The linear head 76 is connected to the elevator floor to drive the elevator 35 in a vertical direction. The elevator 35 moves in the vertical direction by the rotation of the gear 75 which engages with the linear head 76. The linear guides 45 are provided to guide the movement of the elevator 35 so as to maintain the horizontal plane of the elevator 35 during the movement.

The tray pushers 26 are provided at the upper part of the tray adjustment bars 25 to press the top tray 90 which is lifted to the predetermined height. The precise positioning for the top tray 90 is necessary because the IC devices on the top tray 90 have to be unloaded by a pick and place mechanism or a robot hand of the test handler. The tray pushers 26 press the top tray 90 against the X and Y walls of the main base 80 to accurately positioning the tray 90 as shown in FIG. 4. The tray 90 is thus fixed to the walls of the main base 80, and thus accurately positioned to avoid the error in the operation of picking the IC devices by the handler system.

To improve a test efficiency, a large number of trays 90 are installed in the tray rack to test a large number of IC devices by the test handler. Loading and unloading the trays 90 in the tray rack are usually performed by a manual labor before and after the test.

In the foregoing example, the tray 90 is fixed to the position in the main base 80 of the handler fairly accurately since the position of the tray 90 is determined by the walls of the main base 80 when pressed by the tray pusher 26. Namely, since the main base 80 is integrally or fixedly provide on the test handler, the relative positioning between the test handler and the trays 90 are achieved with high accuracy by the arrangement of FIGS. 3–5.

However, the loading and unloading of the trays 90 to and from the tray installation rack is proceeded by human workers. Further, since moving parts of the handler, such as the pick and place mechanism, are provided at the upper position of the tray installation rack, an enough space for loading and unloading the large number of trays by the human workers is not available.

FIGS. 6 and 7 show a second example of a conventional tray installation rack. This tray installation rack is primarily designed to ease the loading and unloading works of the trays by providing a mechanism for moving the tray installation rack in a horizontal direction on the test handler.

FIG. 6 is a perspective view while FIG. 7 is a side view of the tray installation rack. Tray installment rack of FIGS. 6 and 7 includes a slide base 5 having slide packs 6, and tray guide bars 15 for positioning the trays 90. As in the example of FIGS. 3–5, the tray rack further includes the adjustment bars 25 and the tray pushers 26. The slide base 5 is mounted on tray rack guide rails 8 provided on the test handler. The slide base 5 serves as a floor for stacking the trays 90 as well as to form a sliding mechanism for horizontally slide on the test handler along the tray rack guide rails 8. A plurality of trays 90 are piled up on the floor of the slide base 5. To accommodate the difference of size, the trays 90 are pressed by the adjustment bars 25 toward the tray guides 15 which form walls to limit the movement of the trays 90 in the X and Y directions.

Similar to the example of FIGS. 3–5, the elevator 35, the linear guides 45, the gear 75 and the linear head 76 are also provided. The trays 90 are lifted to a predetermined position by the elevator 35 so that the tray 90 at the top position is accessed by a pick and place mechanism or a robot hand to replace the IC devices to the test handler as mentioned above. The elevator 35 includes the linear guides 45, the gear 75 and the linear head 76 to accurately drive the elevator 35 in the up and down direction. The elevator 35, the linear guides 45, the gear 75, the linear head 76, and the tray rack guide rails 8 are fixedly provided on the main base 80.

The example of FIGS. 6 and 7 is provided with the slide pack 6 for pulling out and pushing in the slide base 5 on the test handler to allow a horizontal movement of the tray rack on the handler. Namely, the slide base 5 is guided by the tray rack guide rails 8 via the slide pack 6 in the direction shown by the arrow on the test handler. The slide pack 6 is provided to allow a smooth movement of the slide base 5 along the tray rack guide rails 8.

Thus, the trays 90 can be replaced when the tray installation rack is pulled out from the position where the elevator is provided. Although not shown, the test handler has, on the upper part of the elevator and the tray installation rack, a mechanism for removing the IC devices from the tray, such as the pick and place mechanism. By shifting the horizontal position of the tray installation rack from the pick and place, a larger space at the top of the tray installation rack is available which makes the tray replacement easy and smooth. Further, since the moving mechanism or components do not exist around the tray installation rack at this position, the tray replacement work is undertaken safely.

The situation where the uppermost tray 90 is vertically lifted to the predetermined position for removing the IC devices to be tested is shown in FIG. 7. The tray guide bars 15 and the tray adjust bars 25 are provided on the slide base 5 to serve as determining the position of the uppermost tray 90. The tray pushers 26 further serve to secure the precise position of the tray 90 by pressing the tray against the tray guide bars 15.

However, in this example, since the positioning of the tray 90 is made with respect to the tray guide bars 15 which are not directly attached to the test handler, such positioning is not necessarily accurate with respect to the test handler, especially with respect to the pick and place mechanism of the test handler. Moreover, because the slide pack 6 is to allow a slidable movement to the tray installation rack, there required subtle gaps between the test handler, i.e., the tray rack guide rails 8 and the slide base 5. Thus, the precise positioning is difficult to attain with respect to the handler, and an error X such as shown in FIG. 7 is unavoidable in the positioning of the tray 90 with respect to the main base 80 or the pick and place mechanism of the test handler.

As note above, in the example of FIGS. 6 and 7, since the positioning standard for the slide base is not directly provided to the test handler, it is not possible to precisely and accurately position the tray installation rack and thus the trays 90 with respect to the test handler. To realize the precise positioning of the tray installation rack, an expensive linear motion guide, for example, has to be used instead of the slide pack of FIGS. 6 and 7 for interfacing the slide base 5 and the test handler.

SUMMARY OF THE INVENTION

It is therefore, an object of the present invention to provide a tray installation rack which is capable of precisely and accurately positioning a tray at the top of the tray installation rack with respect to a test handler.

It is another object of the present invention to provide a tray installation rack which is capable of easily and safely loading and unloading the trays before and after the test of the IC devices.

It is a further object of the present invention to provide a tray installation rack which is capable of precisely and accurately positioning a tray at the top of the tray installation rack with respect to a test handler without incorporating an expensive mechanism.

It is a further object of the present invention to provide a tray installation rack which is capable of sliding on the test handler for loading and unloading a large number of trays and accurately positioning the trays with respect to the test handler.

In order to accomplish the task, the length of the tray guide bars in the present invention are shortened with respect to the length of the tray adjust bars compared with the conventional example of FIGS. 6 and 7. Over the top of the tray guide bars, tray standard bars are arranged on a main base of the test handler system.

When the tray is lifted to the uppermost level of the tray installation rack by an elevator, the uppermost tray that has been positioned by the tray guide bar, is then positioned by the tray standard bars. A tray pusher is installed on each tray adjust bar in the X and Y directions at the level corresponding to the height of the tray standard bar. The uppermost tray is pressed against the tray standard bar by the tray pusher.

As result of which, the uppermost tray is precisely positioned with respect to the test handler because the tray standard bars are fixed to the main base of the test handler. The tray installation rack can be pulled out together with the tray, and the trays can be replaced when the tray installation rack is pulled out and thus an enough space is available around the tray installation rack.

The tray installation rack of the present invention is used for a test handler to install therein a plurality of trays each of which has a large number of IC devices to be tested. The tray installation rack includes: a main base fixed to the test handler; a slide base slidably mounted on the main base and has a floor for receiving the trays thereon; a pair of tray guide bars perpendicularly mounted on the slide base to meet two adjacent sides of each of the trays for limiting movements of the trays in two horizontal directions; a pair of tray adjust bars slidably provided on the slide base to press the trays against the pair of guide bars in the two horizontal directions; an elevator provided on the test handler to lift the trays in a vertical direction in the tray installation rack until an uppermost tray exceeds top ends of the tray guide bars; a pair of tray pushers provided at top portions of the tray adjust bars; and tray standard members mounted on the main base at immediately above the top ends of the tray guide bars to restrict movements of the uppermost tray in the two horizontal directions; wherein the uppermost tray is positioned when the uppermost tray is pressed by the tray pushers against the tray standard members.

According to the present invention, the tray standard members (bars) are provided in the X and Y directions of the main base of the handler system which has a pick and place mechanism for removing the ID devices from the tray and placing the IC devices on the test tray. When the tray is lifted by the elevator to the level where the tray standard bars are provided, the positioning function is transferred to the tray standard bars. Thus, horizontal level of the tray is maintained by the elevator while the positioning in the X and Y directions are precisely determined by the tray standard bars when the tray is pressed by the tray pushers against the tray standard bars.

Accordingly, problems involved in the conventional tray installation rack are eliminated. For example, there was a problem in which the IC devices on the tray are not in the accurate positions such that a suction inlet of the pick and place mechanism cannot properly attract the IC devices. In the other problem, the pick and place mechanism cannot accurately place the IC devices that have been tested on the tray based on the test results. These problems are solved in the present invention.

The tray installation of the present invention can be slidably movable together with the trays 90 on the test handler. Hence, the trays can be easily replaced when the tray installation rack is separated from the elevator and pick and place mechanisms. Since the tray replacement, i.e., the loading and unloading, is taken place where an enough space is secured around the tray installation rack and no moving mechanism exist proximate to the tray rack, the exchange of the trays can be safely and efficiently performed.

DETAILED DESCRIPTION OF THE PREFERRED EMBODIMENTS

Figure 1:
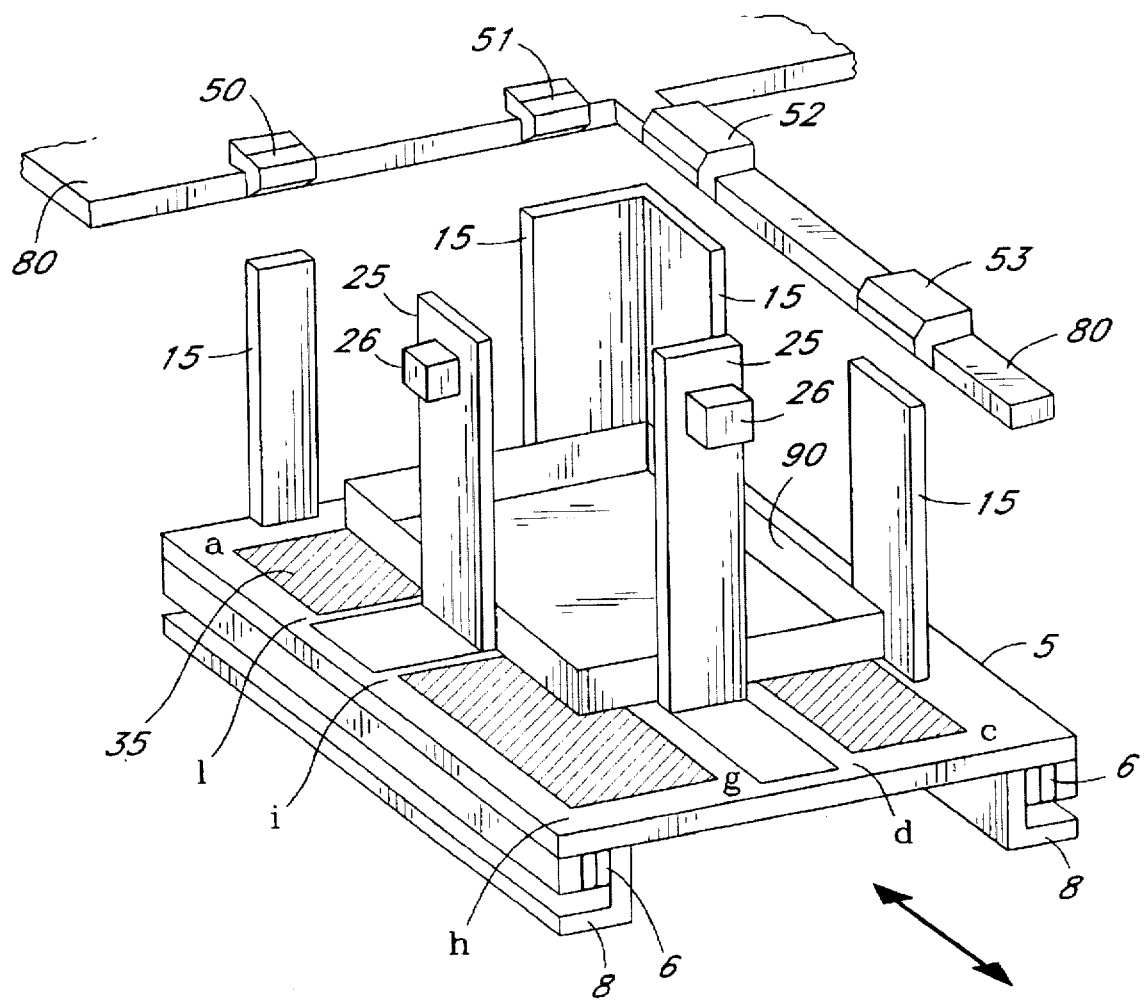
FIG. 1 is a perspective view showing an embodiment of the tray installation rack for a test handler system according to the present invention.
Figure 2:
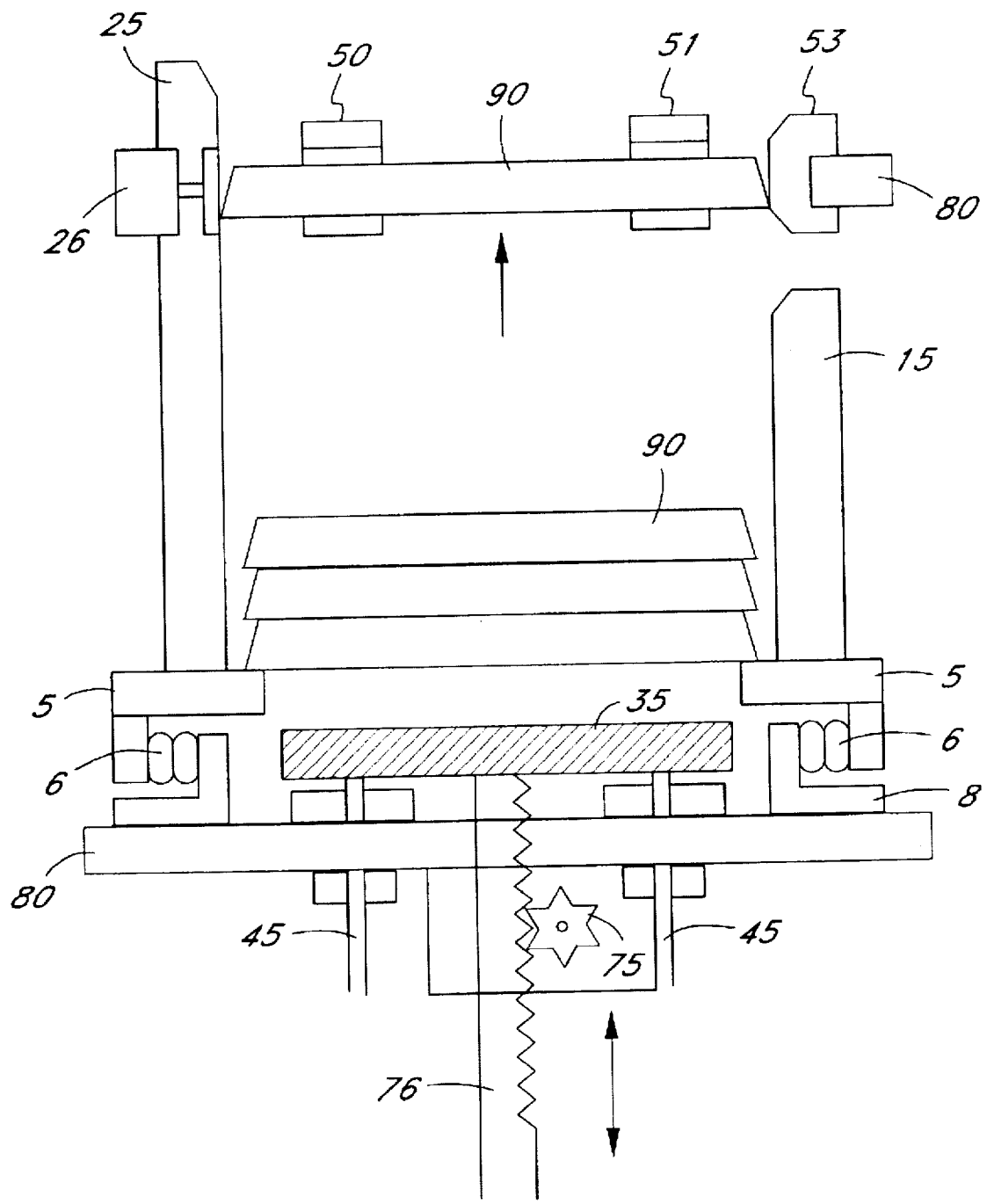
FIG. 2 is a side view showing the tray installation rack of the present invention shown in FIG. 1.
Figure 3:
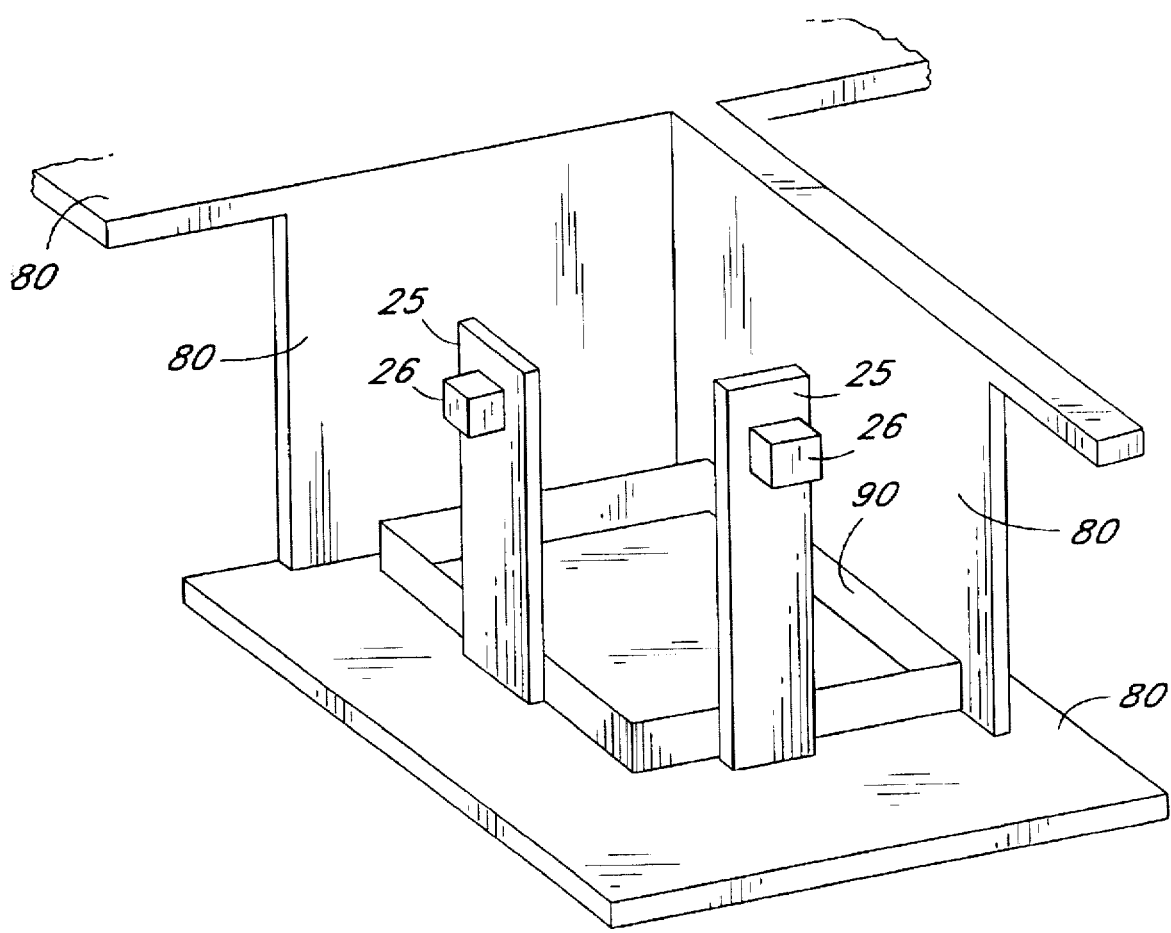
FIG. 3 is a perspective view showing a first example of conventional tray installation rack.
Figure 4:
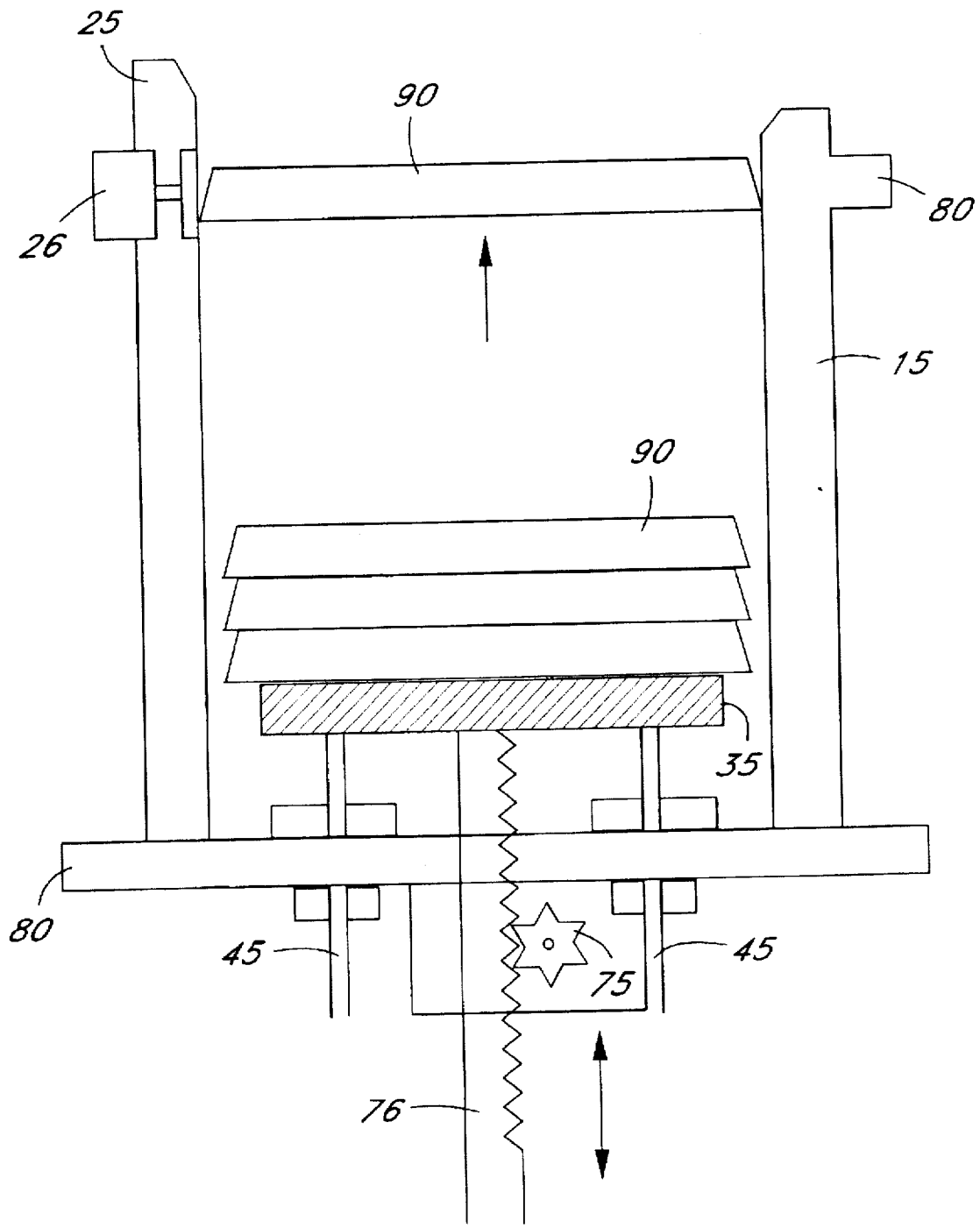
FIG. 4 is a side view showing the first example of tray installation rack of FIG. 3.

The preferred embodiment of the present invention will be explained with reference to the drawings. FIG. 1 and 2 explains the tray installment rack of the present invention to be used for the test handler system. FIG. 1 is a perspective view showing an embodiment of the tray installation rack for the test handler system of the present invention. FIG. 2 is a side view showing the tray installation rack of the present invention of FIG. 1. For convenience and ease of description, the reference numerals used in FIGS. 1 and 2 correspond to the similar portions of the conventional tray rack of FIGS. 6 and 7.

As shown in FIG. 1, the tray guide bars 15 for positioning the tray are arranged in the X and Y directions while crossing together at 90 degrees on the slide base 5. The slide base 5 serves as a floor on which a plurality of trays 90 are stacked before and after the testing as shown in FIG. 2. The slide base 5 has a large opening for the elevator 35 moving in the vertical direction to place the top tray 90 at the position for removing the IC devices therefrom. The tray adjust bars 25 fix the trays 90 by pushing them against the tray guide bars 15 in the X and Y directions, which accommodate trays 90 of different sizes. Thus, positioning for the tray guide bar 15 on the tray slide base 5 is performed.

At the slide base 5, the slide pack 6 which works as promoting the movement of the slide base 5 along the tray rack guide rails 8. Thus, the slide base 5 can be horizontally pulled out to the front of the test handler where the trays 90 can be loaded on or unloaded from the tray installation rack.

Figure 5:
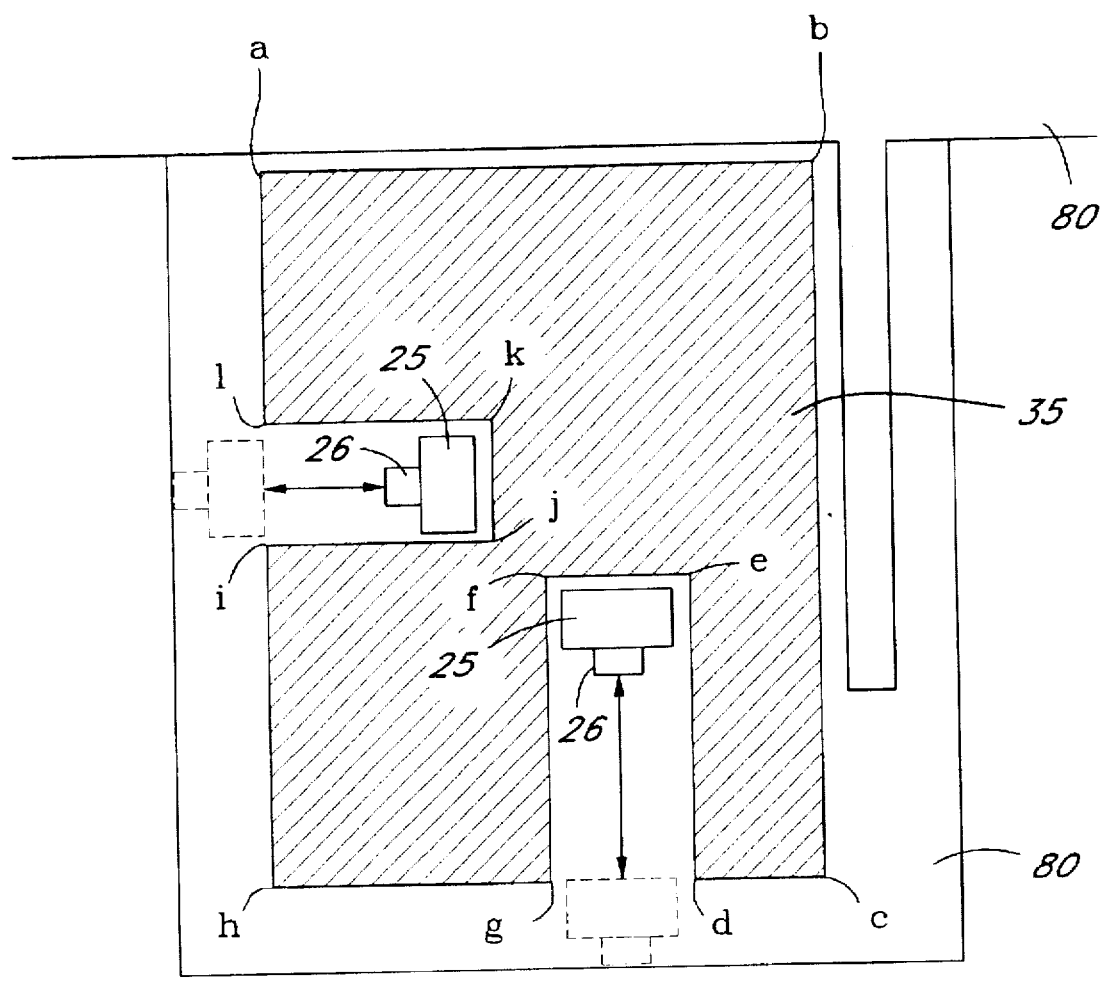
FIG. 5 is a plan view showing the first example of tray installation rack of FIG. 3 including an elevator for lifting the trays.

Similar to the description made with reference to FIG. 5, the horizontal surface of the elevator 35 which lifts the trays 90 is widely formed to receive the largest size trays 90 except for the area wherein the try adjust bars 25 move toward the X and Y directions. Namely, as shown in FIGS. 1 and 5, the elevator 35 has a surface area defined by a, b, c, d, e, f, g, h, i, j, k, l in which areas defined by d-e-f-g and i-j-k-l are excluded for allowing the movement of the tray adjust bars 25. Hence the trays 90 can be aligned with reference to the tray guide bars 15 regardless of their size when pressed against the tray guide bars 15 while the trays 90 can be vertically moved by the elevator 35.

In the present invention, for accurately positioning the tray 90 at the top of the tray installation rack for picking the IC devices, the tray standard bars 50-53 are provided in the X and Y directions on the main base 80 of the test handler system. The tray standard bars 50-53 ultimately determine the position of the top tray 90 when the tray 90 is pressed against the standard bars 50-53 by the tray pushers 26 provided at the top portion of the tray adjust bars.

Figure 6:
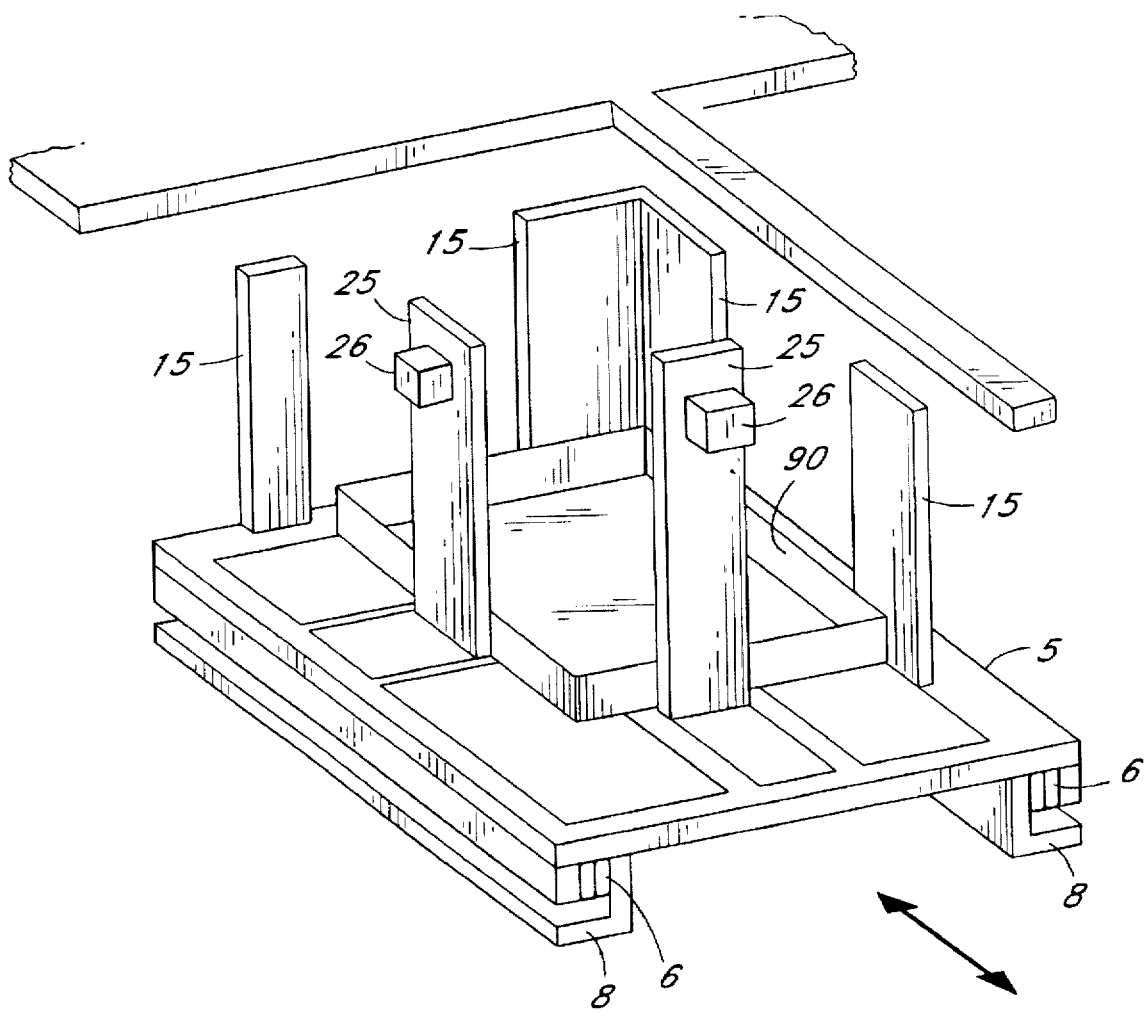
FIG. 6 is a perspective view showing a second example of conventional tray installation rack.
Figure 7:
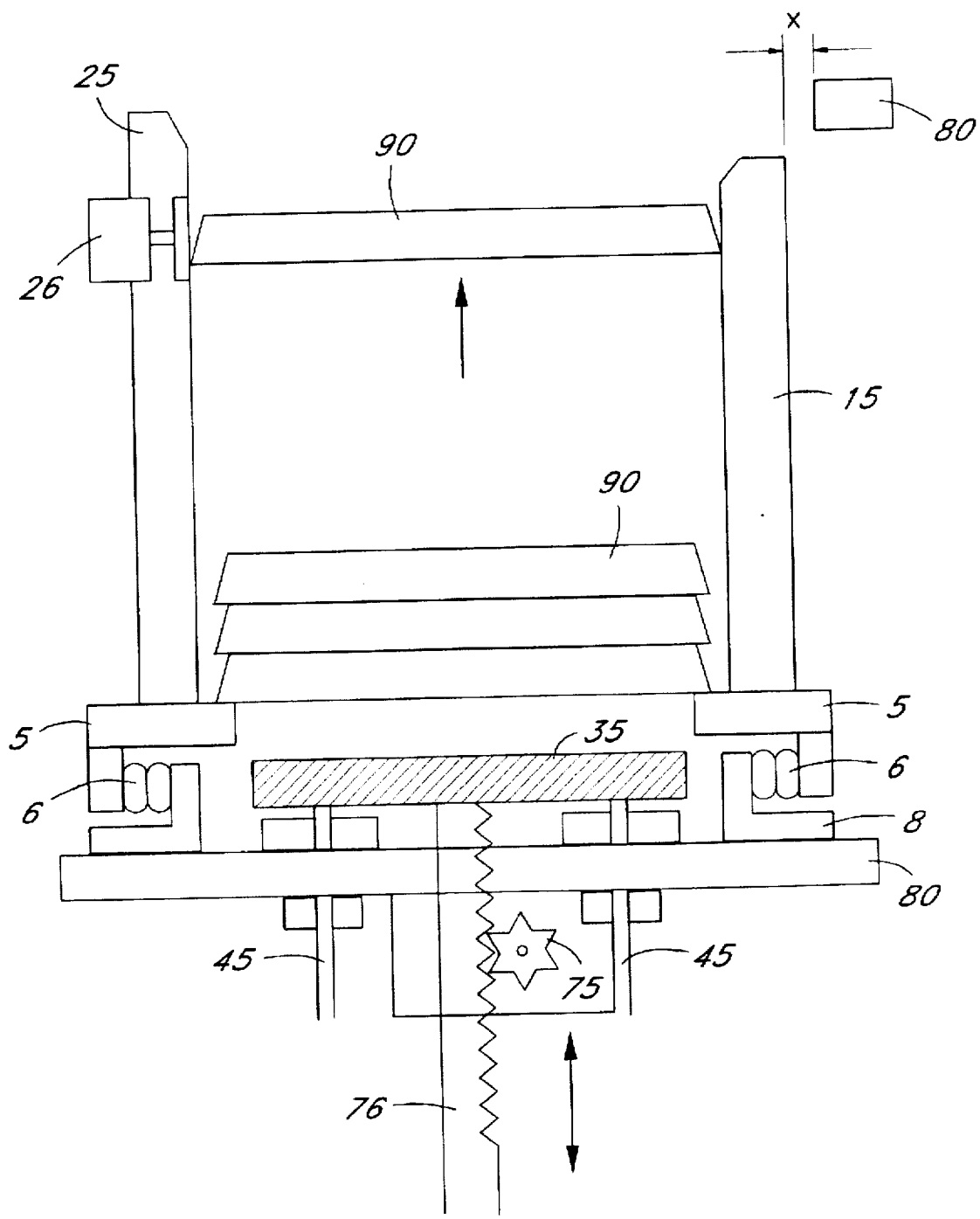
FIG. 7 is a side view showing the second example of tray installation rack of FIG. 6.

As explained above, the trays 90 are first positioned by the tray guide bars 15 when pressed thereto by the tray adjust bars 25. Then, the trays are lifted by the elevator 35 until the uppermost tray 90 comes to the predetermined level of the tray installation rack. As shown in FIG. 2, the length of the tray guide bars 15 are shorter compared with the tray adjust bars 25. Immediately above the top of the tray guide bars 15, the tray standard bars 50-53 are arranged in the X and Y directions. The tray standard bars 50-53 are provided on the main base 80 rather than the slide base 5 as shown in FIGS. 6 and 7.

Thus, when the top trays 90 are lifted by the elevator 35 and the top tray 90 reaches the predetermined upper level, the tray 90 which has been positioned by the tray guide bars 15 is transferred to the positioning by the tray standard bars 50-53. To meet the height of the tray standard bars 50-53, the tray pushers 26 are attached to the tray adjust bars 25 which are movable in the X and Y directions. Thus, the uppermost tray 90 is pressed against the tray standard bars 50-53 by the tray pushers 26. As a result, the tray 90 is precisely positioned with respect to the test handler because the tray standard bars 50-53 are integrally or fixedly provided on the main base 80 of the test handler as noted above.

In this arrangement, the tray guide bars 15 only function to position the tray 90 to a certain degree before the tray 90 is ultimately positioned by the tray standard bars 50-53. Hence, the precise alignment of the tray guide bars 15 or the slide base 5 is unnecessary, which does not require to employ an expensive mechanism such as a linear motion guide.

The above tray standard bars 50-53 only need to secure the positioning the trays with respect to the main base 80 of the test handler. Although four tray standard bars are shown in the example of FIG. 1, only one tray standard bar can be utilized for each of the X and Y directions facing the tray adjust bar. Alternatively, three or more standard bars can be used for each of the X and Y directions. The tray pushers 26 are provide with a drive mechanism (not shown) such as an air cylinder to give a pressure to the tray 90. The tray pushers 26 are preferably made of an elastic material to flexibly press the tray 90.

As in the foregoing, according to the present invention, the tray standard bars are provided in the X and Y directions of the main base of the handler system which has the pick and place mechanism for removing the IC devices from the tray and placing the IC devices on the test tray. When the tray is lifted by the elevator to the level where the tray standard bars are provided, the positioning function is transferred to the tray standard bars. Thus, horizontal level of the tray is maintained by the elevator while the positioning in the X and Y directions are precisely determined by the tray standard bars when the tray is pressed by the tray pushers against the tray standard bars.

Accordingly, problems involved in the conventional tray installation rack are eliminated. For example, there was a problem in which the IC devices on the tray are not in the accurate positions such that a suction inlet of the pick and place mechanism cannot properly attract the IC devices. In the other problem, the pick and place mechanism cannot accurately place the IC devices that have been tested on the tray based on the test results. These problems are solved in the present invention as in the foregoing.

The tray installation of the present invention can be slidably movable together with the trays 90 on the test handler. Hence, the trays can be easily replaced when the tray installation rack is away from the elevator and pick and place mechanisms. Since the tray replacement, i.e., the loading and unloading, is taken place where the enough space is secured around the tray installation rack and no moving mechanism exist proximate to the tray rack, the exchange of the trays can be safely and efficiently performed.

What is claimed is:

1. A tray installment rack for a test handler to install therein a plurality of trays each of which has a large number of IC devices to be tested, comprising:

a main base fixed to said test handler;

a slide base slidably mounted on said main base and has a floor for receiving said trays thereon;

a pair of tray guide bars perpendicularly mounted on said slide base to meet two adjacent sides of each of said trays for limiting movements of said trays in two horizontal directions;

a pair of tray adjust bars slidably provided on said slide base to press said trays against said pair of guide bars in said two horizontal directions;

an elevator provided on said test handler to lift said trays in a vertical direction in said tray installation rack until an uppermost tray exceeds top ends of said tray guide bars;

a pair of tray pushers provided at top portions of said tray adjust bars; and tray standard members mounted on said main base at immediately above said top ends of said tray guide bars to restrict movements of said uppermost tray in said two horizontal directions;

wherein said uppermost tray is positioned when said uppermost tray is pressed by said tray pushers against said tray standard members.

2. A tray installation rack as defined in claim 1, wherein said trays in said tray installation rack are positioned by said tray guide bars when pressed by said tray adjust bars against said tray guide bars in said two horizontal directions while said uppermost tray is positioned by said tray standard members when pressed by said tray pushers against said tray standard members in said two horizontal directions.

3. A tray installation rack as defined in claim 1, wherein said tray installation rack further includes a slide pack at a lower portion of said slide base so as to allow a slidable movement of said tray installation rack in a horizontal direction on said test handler.

4. A tray installation rack as defined in claim 3, wherein tray rack guide rails are provided on said main base of said test handler, said tray rack guide rails interact with said slide pack to promote said slidable movement of said tray installation rack.

5. A tray installation rack as defined in claim 1, wherein said elevator is mounted on said main base of said test handler, said slide base has an opening on said floor to allow an up and down movement of said elevator for lifting said trays.

6. A tray installation rack as defined in claim 1, wherein said slide base slidably move on said test handler to a position apart from said elevator and said tray standard members so as to secure easy loading and unloading of trays for said tray installation rack.

7. A tray installation rack as defined in claim 1, wherein said elevator moves in said vertical direction when guided by a linear guide.

8. A tray installation rack as defined in claim 1, wherein said tray pushers are driven by air cylinders provided with compressed air.

9. A tray installation rack as defined in claim 1, wherein said tray pushers are made of an elastic material.

* * * * *